United States Patent [19]

Kandyba et al.

[11] 4,178,602

[45] Dec. 11, 1979

[54] THIN FILM CRYOTRON

[76] Inventors: Petr E. Kandyba, korpus 438, kv. 11; Dmitry P. Kolesnikov, korpus 301 b, kv. 111; Nina I. Komarovskikh, korpus 431, kv. 116; Gennady M. Lapir, korpus 851, kv. 69; Konstantin K. Likharev, Leninsky prospekt, 93, kv. 200; Vadim A. Ryzhkov, korpus 331, kv. 87; Viktor G. Yastrebov, korpus 909, kv. 122, all of Moscow, U.S.S.R.

[21] Appl. No.: 829,527

[22] Filed: Aug. 31, 1977

[51] Int. Cl.² .................................... H01L 27/12
[52] U.S. Cl. .................................... 357/4; 357/5; 307/212
[58] Field of Search .................. 357/4, 5; 307/212

[56] References Cited

U.S. PATENT DOCUMENTS

| | | | |
|---|---|---|---|
| 3,803,459 | 4/1974 | Matisov | 317/234 T |
| 3,852,795 | 12/1974 | Ames | 357/5 |

OTHER PUBLICATIONS

Mercereau, J. Val. Sci. Technol., vol. 10, No. 5, Sep.-/Oct. 1973.
Palmer et al., *Appl. Phys. Lett.* vol. 25, No. 9, Nov. 1, 1974, pp. 527 et seq.

*Primary Examiner*—Martin H. Edlow
*Attorney, Agent, or Firm*—Lackenbach, Lilling & Siegel

[57] ABSTRACT

A thin-film cryotron using a distributed Josephson junction is proposed. The functions of the Josephson junction are performed by a bridge of variable thickness. The control line is located above one of the contact electrodes, and it may be displaced from the boundary between the electrode and the bridge jumper by a distance less than the width of the bridge jumper or it may be placed so that one of its sides is coincident with this boundary. The electrode which has the control line located above it may be provided with a hole made near the control line on the side opposite to the jumper.

8 Claims, 16 Drawing Figures

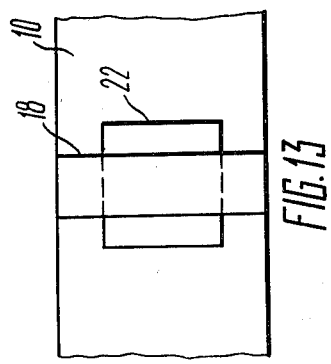
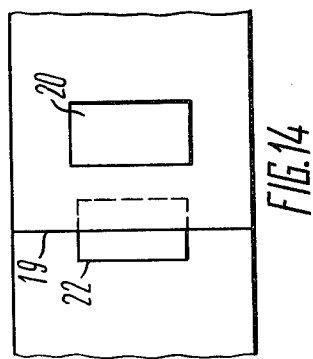
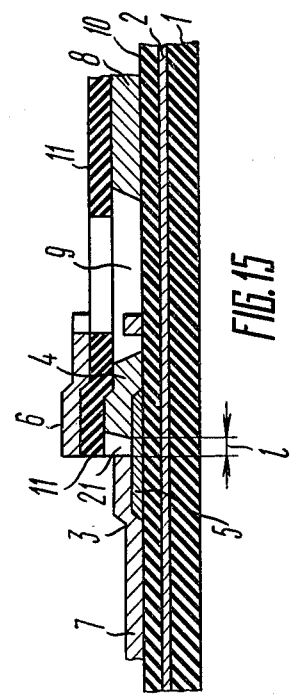
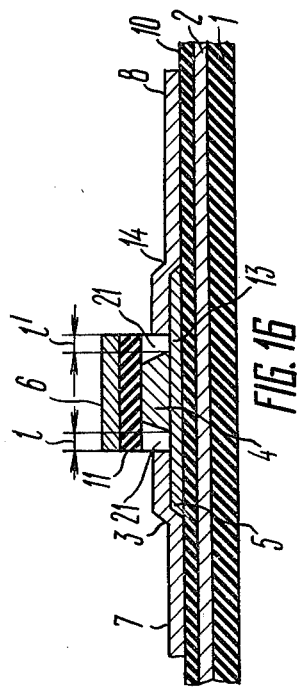
FIG.13
FIG.14
FIG.15
FIG.16

THIN FILM CRYOTRON

FIELD OF THE INVENTION
BACKGROUND OF THE INVENTION

The present invention relates to superconducting microelectronic devices used in digital computer hardware and, in particular, to thin film cryotrons serving as superconducting switching devices based on the Josephson effect, as well as to methods of manufacturing them.

DESCRIPTION OF THE PRIOR ART

Known in the prior art is a thin film cryotron acting as a superconducting switching device in which the critical current flowing through the tunnel Josephson junction is controlled due by the effects of a magnetic field on the junction.

This cryotron comprises a superconducting ground plane, two film superconducting electrodes with lead-in paths which form a distributed tunnel Josephson junction, and a control line, these elements of the device being arranged one above the other and isolated electrically from each other. The tunnel junction is made as a three-layer structure with a thin (about 10 A to 20 A) insulating barrier layer separating the electrodes.

A thicker semiconductor layer may be substituted for this insulating barrier layer.

The cryotron will be switched when a current flows through its control line. The current generates a magnetic field which affects the tunnel junction located below the control line and reduces the value of the junction critical current. Hence, when the current flowing through the junction is below the critical value, the junction voltage drop will be zero, but after the current flows through the control bus, this voltage drop will reach a certain finite level.

Due to the use of the tunnel junction made as a thin insulation layer the above cryotron suffers from inadequate raliability and stability while the reproducibility of its performance is insufficient.

Besides, the substantial electrical capacity, which is common for a tunnel contact with a thin isolation layer, results in spurious resonance effects in the contact and makes it difficult to obtain a high speed operation in switching circuits which use this cryotron.

The presence of such a substantial electrical capacity also results in a hysteresis that appears in the current-voltage response of the cryotron due to which it becomes difficult to use it in networks. The hysteresis may cause, in particular, irreversible switching ("latching" effect), which can be overcome by applying special quenching or disabling pulses to the cryotron input. These pulses interrupt the current flowing through the cryotron contact and reset it to the state of superconductivity. Thus, the respective circuits become complex and slow.

The above difficulties are partially obviated when the barrier layer in the tunnel junction is made as a thicker layer of a semiconductor material. However, it is quite difficult technologically to obtain reproducible performance characteristics in junctions that have high density critical currents.

Known in the art are other types of distributed Josephson junctions, the critical current of which is sensitive to the magnetic field just as that of the tunnel junctions described above. In such junctions there are no thin barrier insulating or semiconductor layers. Instead they use proximity effect bridges (see H. A. Notarys and J. E. Mercereau, J. Vac. Sci. Techn., 1973, Vol. 10, No. 5, pp. 646–651). sandwich S-N-S type structures or bridges of variable thickness. The most promising is the bridge of variable thickness which is made as two superconducting film electrodes with a weak link between them realized with the help of a conducting jumper made as a film thinner than the electrodes. The bridge of variable thickness is characterized by a low spurious capacitance with a sufficiently high critical current-resistance product and high density of the critical current.

However, the present state of the art is unable to devise a sufficiently simple technology to produce a thin film cryotron structure based on a distributed Josephson junction whose spurious cpacitance would be negligibly small while the critical current density would be sufficiently high.

SUMMARY OF THE INVENTION

The main object of the present invention is to provide a thin film cryotron based on a distributed Josephson junction having a negligibly small spurious capacitance.

Another object of the invention is to produce a cryotron that would be characterized by a high value of the critical current-resistance product.

Still another object of the invention is to provide a high critical current density in the cryotron.

One more object is to increase the speed of operation of the thin film cryotron.

Another object is to design a cryotron that would have no hysteresis in its current-voltage responsive curve.

Another object of the invention is to provide a method of manufacturing such a cryotron with the help of available technological procedures.

The above objects of the present invention are achieved by providing a film cryotron comprising a superconducting ground plane, two film superconducting electrodes with lead-in paths forming a distributed Josephson junction and a control bus arranged in a stack one above another and being isolated electrically from each other. According to the invention, the Josephson junction is made as a bridge of variable thickness. The control line is located above one of the electrodes and it is displaced from the boundary between the electrode and a bridge jumper by a distance less than the bridge jumper width or it has one of its sides coincident with this boundary.

In order to increase the efficiency of the bridge critical current control, it is preferable that the electrode that has the control line located above it be provided with a hole made near the control line on the side opposite to the jumper.

In the preferred embodiment that provides the highest current gain, one of the sides of the control line is coincident with the boundary between the electrode and the bridge jumper and the edge of the hole is made coincident with the other side of the control line.

Preferably, in order to increase the cryotron output and the speed of operation, the device is provided with an additional jumper and an additional electrode connected in series between the principal electrode with the control line above it and its lead-in path and arranged to form, in combination with this electrode, a second bridge of variable thickness, the length of the principal electrode being selected so that the gap between the control line and the boundary between the principal electrode and the additional jumper would not exceed the width of the additional jumper.

Conveniently, in order to increase the current gain, the cryotron provided additionally with a jumper and an electrode has the control line arranged so that one of its sides is coincident with the boundary between the principal electrode and the principal jumper and the opposite side of the line is coincident with the boundary between the additional electrode and the additional jumper.

In a method of manufacturing a thin-film cryotron a substrate is made to bear a number of layers applied thereon in succession, namely, a first layer of a superconducting material to make a ground plane, a first insulation layer with a metal film area formed on it to produce a bridge jumper, a second layer of superconducting material in which two parallel boundaries of the principal electrode are formed, a second insulation layer and a third layer of superconducting material, this third layer being used to form a control line above the principal electrode is transverse to the boundaries of this electrode according to the invention, after the second insulation layer is applied, a mask determining the electrode edges located along the sides of the control line is used to etch the second insulation layer and then the second layer of superconducting material, the etching procedure continuing until the material of these layers in the areas unprotected by the mask is removed completely and said boundaries are formed. Then the second superconducting layer is provided with an insulation region located along the boundaries that have been formed in the course of the etching procedure. The depth of the insulation region is dependent on the length of the bridge jumper. The third superconducting layer is provided with a break in it which is made in the course of its application, the break being made at the electrode boundaries arranged along the sides of the control line. The rest of the cryotron electrodes are formed from the third superconducting layer simultaneously with the forming of the control line.

When using this procedure, the insulation region may be obtained either by etching the second superconducting layer or by oxidizing the second superconducting layer.

Major advantages of the cryotron proposed herein are as follows.

1. The substitution of a bridge of variable thickness for the tunnel junction makes it possible to increase the reliability and the performance reproducibility of the device since the minimum length of the bridge jumper is from $10^2$ to $10^3$ times greater than the thickness of the barrier layer in the tunnel contact. Evidently, elements of such dimensions are easier to obtain and to control with the required relative tolerances, while the effect of diffusion and other destructive processes on the jumper is considerably lower than on a thin barrier isolation layer.

2. The spurious capacitance of the bridge of variable thickness is negligibly small. Therefore, in contrast to a tunnel junction cryotron the device proposed herein ensures a priori that switching processes in superconducting circuits are aperiodic. The result is that, when the proposed cryotron is used, no spurious oscillatory effects in the circuits appear. Hence, it is easier to obtain circuits having the maximum speed of operation.

3. The low spurious capacitance of the bridge of variable thickness eliminates the hysteresis in the current-voltage response of the cryotron proposed herein. The result is that from the zero voltage drop the cryotron is switched to the finite voltage state and vice versa at the same value of the control current flowing through it. Hence, there is no need for special quenching pulses or other complexities in the circuits to be used in tunnel junction devices to eliminate unwanted hysteresis effects.

The method of manufacturing such a cryotron proposed herein is advantageous in that the submicrometer gap between the electrodes equal to the jumper length is obtained with the help of simpler indirect procedures. It allows formation of all the electrodes with the required gaps and the control line of the cryotron in the course of two operations envolving the application of superconducting layers. Besides, the method makes it possible to obtain a control line such that its sides formed due to the discontinuity of the respective layer at a relief step are automatically aligned precisely with the bridge jumper and with the edge of the hole made in the electrode. The latter factor is of considerable importance because the precise alignment mentioned above makes it possible to obtain the highest efficiency of controlling the value of the bridge critical current with the help of the magnetic field generated by the control current. Hence, the cryotron can operate with the maximum current gain.

BRIEF DESCRIPTION OF THE DRAWINGS

The invention will be better understood from the following description of its embodiments given by way of example with reference to the accompanying drawings in which:

FIG. 13 is a top, plan view of the cryotron shown in FIG. 11;

FIG. 14 is a top, plan view of a cryotron in which one of the electrodes is provided with a hole made after the mask etching is over in the course of the manufacturing procedure, according to the invention;

FIG. 15 is a longitudinal section of a film cryotron in which one of the electrodes with an insulation region is provided with a hole made by means of etching, according to the invention and FIG. 16 is a longitudinal section of a thin-film cryotron provided with an additional jumper and an additional electrode having an insulation region made by means of etching, according to the invention.

DETAILED DESCRIPTION OF THE INVENTION

Figure 1:
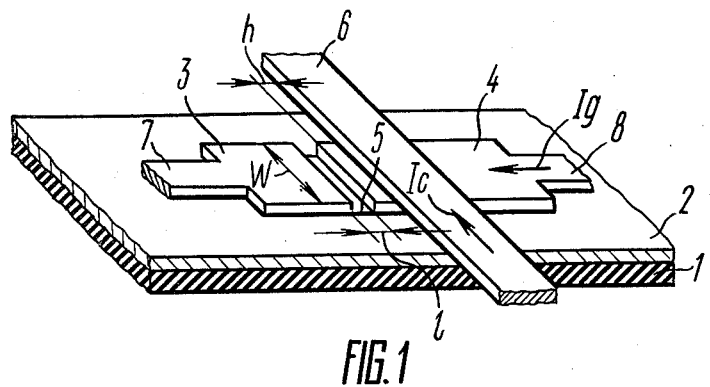
FIG. 1 is an isometric view showing the design of a thin-film cryotron, according to the invention.

The thin-film cryotron, shown in FIG. 1, comprises a series of elements applied onto an insulating substrate 1, viz. a superconducting ground plane 2, thin-film superconducting electrodes 3 and 4 insulated from the ground plane 2 and interconnected by a conducting jumper 5 that forms, in conjunction with them, a bridge of variable thickness, and a control line 6 located above the electrode 4 near the jumper 5 and insulated from this electrode 4.

The jumper 5 can be made either of a superconducting material or of a material having normal conductivity (in the latter case the effect of superconductivity in the jumper 5 appears due to the proximity of the material of superconducting electrodes 3 and 4). A bridge of variable thickness exhibiting the Josephson effect will be obtained under the condition that the length l of the jumper 5, which is equal to the gap between the electrodes 3 and 4, is sufficiently small. The length should be of the order of the coherence length in the jumper 5 material. In practice it is about 0.1 to 1.0 μm. The width W of the jumper 5 may greatly exceed its length l. Reference character $I_g$ in FIG. 1 indicates a current flowing through the bridge (the gate current) and reference character $I_c$ indicates a current flowing through the control line 6 (the control current).

The line 6 is located above the electrode 4 and is displaced a distance h from the boundary between the electrode 4 and the jumper 5. The value of h does not exceed that of W. The functions of lead-in paths 7 and 8 of the electrodes 3 and 4 are performed by sections thereof which are the continuations of the electrodes 3 and 4 in the directions away from the line 6.

FIG. 1 does not show the insulation layers in order to simplify the drawing.

Figure 2:
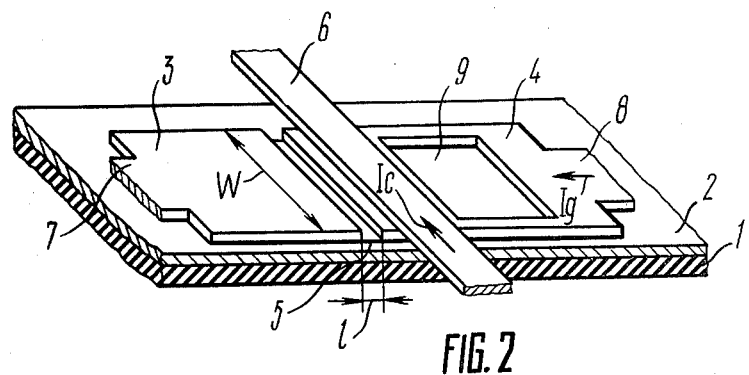
FIG. 2 is an isometric view showing the design of a thin-film cryotron in which one of the electrodes is provided with a hole, according to the invention.

FIG. 2 is an isometric view of an embodiment of a cryotron which differs from that in FIG. 1 in that its electrode 4 is provided with a hole located near the line 6 on the side opposite the jumper 5.

The size of the hole 9 is selected so that the loop inductance in the electrode 4 surrounding this hole exceeds that of the part of the line 6 located above the electrode 4. The insulation layers are not shown in FIG. 2 either.

Figure 3:
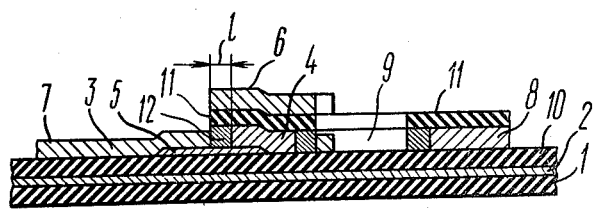
FIG. 3 is a longitudinal section of a thin-film cryotron in which one of the electrodes of which is provided with a hole, according to the invention.

FIG. 3 shows a longitudinal section of a cryotron whose electrode 4 is provided with a hole 9. Located between the ground plane 2 and the electrodes 3 and 4 is a first insulation layer 10. The electrode 4 is insulated electrically from the control line 6 by a second insulation layer 11. The length l of the jumper 5 in the bridge of variable thickness is determined in this case by the depth of an insulation region 12.

Figure 4:
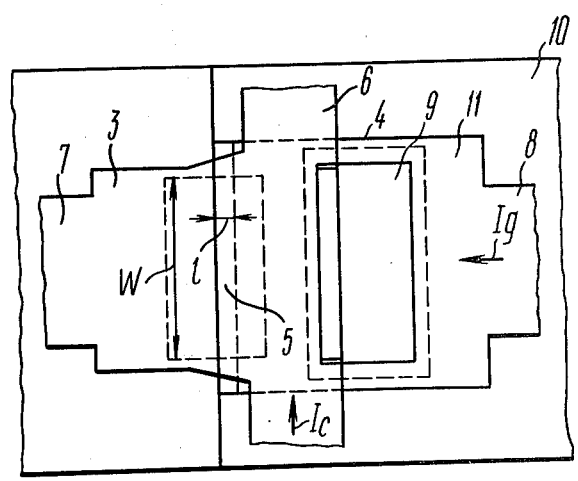
FIG. 4 is a top, plan view of the thin-film cryotron shown in FIG. 3.

FIG. 4 presents a plan view of the same cryotron as shown in FIG. 3. From FIGS. 3 and 4 it is evident that the present embodiment of the cryotron differs from the other embodiments in that one side of its control line 6 is precisely aligned with the boundary between the electrode 3 and the bridge jumper 5 and the opposite side of the line 6 is precisely at the edge of the hole 9. The insulation region 12 which determines the location and the length l of the bridge junction 5 is arranged along the boundary of the electrode 4.

Figure 5:
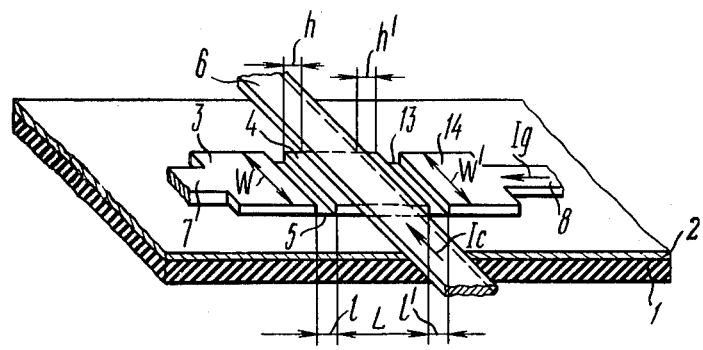
FIG. 5 is an isometric view of a thin-film cryotron provided with an additional jumper and an additional electrode, according to the invention.

FIG. 5 presents an isometric view of a cryotron which differs from the embodiment shown in the above figures in that it is provided with an additional jumper 13 and an additional electrode 14 which are connected in series between the principal electrode 4 and its lead-in path 8. Together with the electrode 4 these two elements form a second bridge of variable thickness. The values of length l' and width W' of the jumper 13 of the second bridge may be selected either the same as those of l and W, respectively, of the jumper 5 of the first bridge or as different ones. However the values of l' and W' should not exceed the limits specified for those of l and W in FIG. 1. The length L of the principal electrode 4 is selected so that the distance h' between the control line 6 and the boundary between the electrode 4 and the jumper 13 does not exceed the width W' of the additional jumper 13.

The use of the second bridge of variable thickness permits an increase in the voltage across the cryotron to a level equal to the sum of the voltages across both bridges. Hence, it becomes possible to increase either the output power or the speed of operation of the cryotron.

Figure 6:
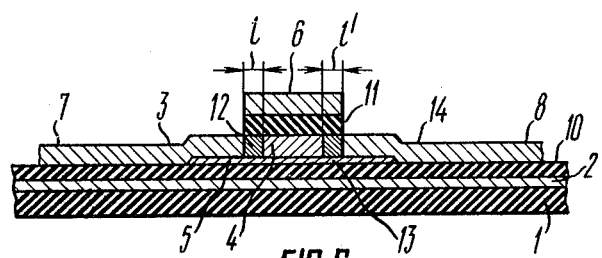
FIG. 6 is a longitudinal section of a thin-film cryotron provided with an additional jumper and an additional electrode, according to the invention.
Figure 7:
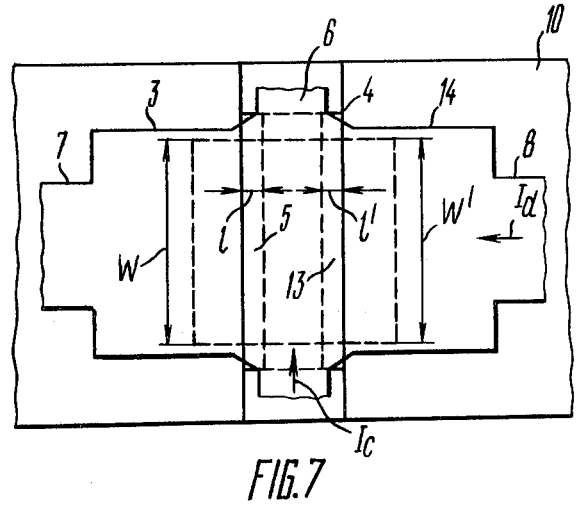
FIG. 7 is a top, plan view of the thin-film cryotron shown in FIG. 6.

FIG. 6 is a section of the cryotron having two bridges of variable thickness. FIG. 7 is a plan view of the same cryotron. In this cryotron design one of the sides of the control line 6 is aligned precisely with the boundary between the principal electrode 3 and the jumper 5 and the opposite side of the control line is aligned precisely with the boundary between the additional electrode 14 and the additional jumper 13. The values of lengths l and l' of the jumpers 5 and 13, respectively, are determined by the depths of the insulation regions 12 made in the electrode 4 along its boundaries that are parallel to the control line 6.

Figure 8:
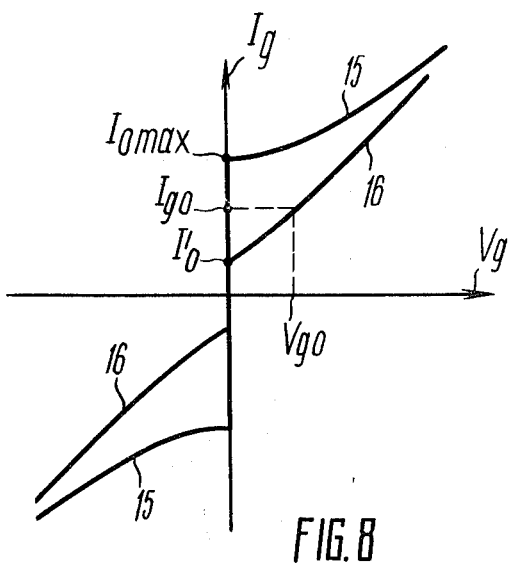
FIG. 8 is a graph showing the current-voltage response curves for different values of the current flowing through the control line of a cryotron, according to the invention.

FIG. 8 shows the dependance of the cryotron current-voltage response on the strength of the control current $I_c$. Curves 15 show the current-voltage curve for $I_c=0$ and curves 16 show to the curve for $I_c=I_{co}\neq 0$, where $I_{co}$ is the value of the critical current.

The Y-axis gives the values of $I_g$ denoting the current which flows through the bridge. The notation $I_o$ denotes the cryotron current at $I_c=0$; $I_o'$ is the value of the critical current at $I_c=I_{co}$.

Figure 9:
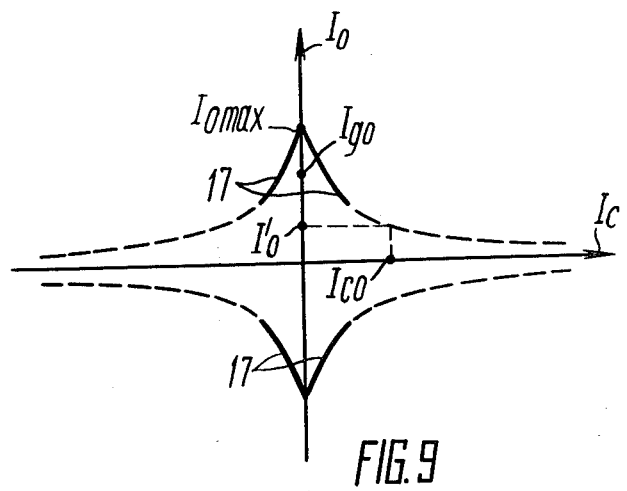
FIG. 9 is a graph showing the critical current vs. the control current of a cryotron, according to the invention.

FIG. 9 shows curves 17 showing qualitatively the dependance of the critical current $I_o$ (given along the Y-axis) on the control current $I_c$ (given along the X-axis). At the starting point, voltage $V_g$ across the cryotron is zero. Outside of this area $V_g\neq 0$. The value of $I_{co}$ corresponds to that value of the control current $I_c$ at which the critical current $I_o$ equals $I_o'$. Dashed lines present those parts of the curves 17 which represent the envelopes of precise ratios between $I_o$ and $I_c$ when $I_c$ has values at which these ratios oscillate ("side lobes").

Figure 10:
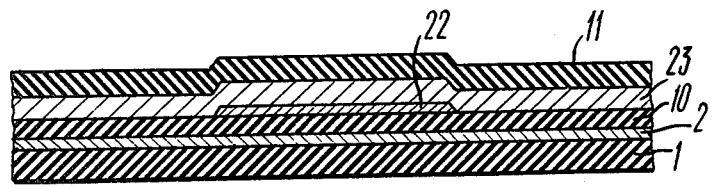
FIGS. 10, 11, and 12 are longitudinal section views showing the sequence of procedures to be employed to manufacture the cryotron shown in FIG. 6, according to the invention.
Figure 11:
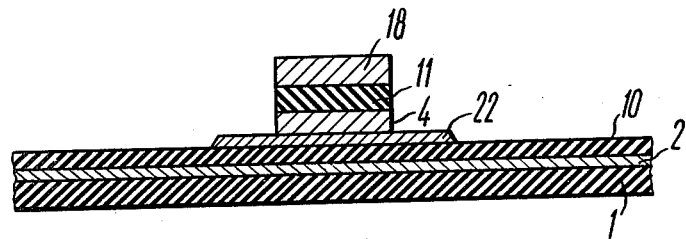
Figure 12:
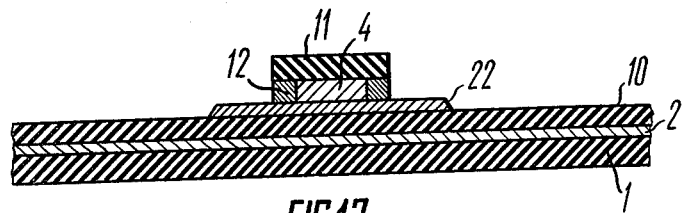

FIGS. 10, 11, 12 and 13 illustrate a method of manufacturing the cryotron in the form of the embodiment shown in FIGS. 6 and 7. FIGS. 10 through 12 show longitudinal sections of the cryotron at different stages of the manufacturing procedure, viz. in FIG. 10 it is shown after the application of the second insulation layer 11, in FIG. 11 it is shown after the completion of the electrode 4 boundaries located along the sides of the control line and in FIG. 12 it is shown after the insulation regions 12 are formed.

FIG. 13 shows the same cryotron viewed from above at the same step of the manufacturing procedure as is shown in FIG. 11, i.e. after the boundaries of the electrode 4 located along the sides of the control line are formed. The cryotron is shown with a mask 18 used in the course of etching to protect the areas of the electrode 4 above which the control bus is to be located.

FIG. 14 shows a cryotron version having a hole in one of its electrodes at an intermediate step of the manufacturing procedure, i.e. after the formation of electrode boundaries parallel to the control line and of the hole in the electrode is complete. In this case the mask 19, in contrast to the above procedure, is provided with a hole 20 which determines the size and the location of the hole to be made in the electrode of the cryotron.

FIGS. 15 and 16 present longitudinal sections of cryotron designs similar to those shown in FIGS. 4 and 7, respectively, the only difference consisting in that insulation regions 21 in the cryotrons shown in FIGS. 15 and 16 are made in the course of an etching procedure in the form of air gaps, the depths of which determine also the lengths l (l') of the bridge jumpers 5(13).

A thin-film cryotron provided with a bridge of variable thickness as shown in FIG. 1 operates as follows.

The critical current $I_o$ of the bridge of variable thickness depends on the strength of the magnetic field affecting the bridge. When this strength is not zero, the critical current decreases in comparison with its maximum value $I_{o\ max}$ (FIG. 9). The lead-in paths 7 and 8 connect the cryotron in series to a DC source (not shown in the drawing). The level of the supply current $I_{go}$ (FIG. 8) is selected below the level of the critical current $I_{o\ max}$. Voltage $V_g$ across the cryotron will be zero until there is no control current $I_c$ flowing through the line 6.

As soon as current $I_c$ starts flowing through the control line 6 there appears a magnetic field producing a flux through the bridge, which reduces the critical current $I_o$. When the current $I_{co}$ flowing through the line 6 reaches a sufficiently high level, the value of the critical current $I_o$ will drop to the level of $I_o'$ which is less than the supply current $I_{go}$. Here, as it is evident from FIG. 8 (curve 16), there appears a certain output voltage $V_{go}$ across the bridge. Since there is no hysteresis in the current-voltage response of the bridge, a turn-off of the current in the control line 6 will bring the output voltage $V_g$ down to zero. In order to make the strength of the magnetic field affecting the bridge sufficiently high, i.e. to ensure that the critical current $I_o$ is controlled with the help of current $I_c$ effectively, the gap between the line 6 and the boundary of the jumper 5 (FIG. 1) should not exceed the width W of the bridge jumper 5.

When the cryotron is designed as shown in FIG. 2 the efficiency of using the critical current $I_o$ for the control purposes is further increased due to the hole 9 in the electrode 4. This hole shortens the path for the lines of magnetic force that form a ring around the line 6 and flow through the bridge.

A further increase of the efficiency in controlling the cryotron with the use of the critical current $I_o$ will be obtained in the design version presented in FIG. 3 where the magnetic flux flowing through the bridge is maximum due to the fact that the line 6 is precisely aligned with the boundary of the electrode 3 and with the edge of the hole 9.

In the cryotron design provided with an additional jumper 13 and an additional electrode 14 (FIG. 5) the magnetic field generated by the current flowing through the line 6 will affect both bridges. The maximum efficiency of controlling the critical current $I_o$ flowing through the bridges will be obtained when the jumpers 5 and 13 are located as close to the line 6 as possible, as is done in the cryotron version shown in FIGS. 6 and 7 in which the sides of the line 6 are made coincident with the boundaries of the electrodes 3 and 14. In this case the ring lines of force of the magnetic field generated by the current $I_c$ which close around the electrode 4 via both bridges have the smallest possible lengths.

The efficiency of controlling the value of the critical current $I_o$ may be characterized by the value G of the gain which is equal to the slope of curve 17 (FIG. 9) when $I_o = I_c$.

The gain G will increase when the width W (W') of the bridge jumper 5 (13) greatly exceeds the characteristic depth to which the magnetic field penetrates the Josephson contact. In the cryotron designs shown in FIGS. 2, 3, 5 and 6 the value G will be maximum when the width W(W') of the bridge jumper 5 (13) is much greater than the gap between the boundaries of the electrode 4 parallel to the sides of the control line 6.

With the increase of W in a cryotron having one bridge (FIGS. 2 and 3) the gain factor G will approach 2. In a cryotron with two bridges (FIGS. 5 and 6) it will approach 1.

The cryotron proposed herein may be manufactured either with the use of available technological methods or with the help of the method proposed in the present invention.

Thus, the cryotron shown in FIGS. 1 and 2 may be manufactured by means of using a substrate 1 and applying onto it in succession a first layer of a superconducting material to form a ground plane 2, a first insulation layer used as a basis for forming a metal film area to make a jumper 5, a second layer of a superconducting material used to electrodes 3 and 4 and, finally, a second insulation layer and a third superconducting layer used to form a control line 6. In this case the submicrometer gap between the electrodes 3 and 4, which determines the length l of the jumper 5 in the bridge of variable thickness, is produced with the use of available thin-film technological methods, for instance, with the use of electron lithography or photolithography methods. Here, the control line 6 is aligned against the electrode 4 located below it with an accuracy which does not exceed the accuracy of aligning the patterns made in two different superconducting layers with respect to each other.

A drawback of this method is that the methods employed to obtain submicrometer gaps between the electrodes 3 and 4 are rather complex and the precise alignment of the control line sides with the electrode boundaries, which is required to manufacture cryotrons as show in FIGS. 3 and 6 presents a rather difficult task in principle.

Cryotron versions presented in FIGS. 3 and 6 are manufactured with the use of the method according to the present invention.

First, an insulation substrate 1 (FIG. 10) is used onto which a first superconducting layer of a ground plane 2 (for instance, of niobium) is applied and onto the latter a first insulation layer 10 (for instance, of $Al_2O_3$) is applied. On the layer 10 is formed an area of a metal film 22 (for instance, of gold) to produce a bridge jumper. The film area 22 could be made with the help of the well known vacuum deposition method with subsequent photolithographic treatment.

A second superconducting layer 23 (for instance, of niobium) is then applied onto the surface of the thin-film area 22. Using the method of photolithography two parallel boundaries of the principle electrode 4 are formed in the second superconducting layer 23. Then, a second insulation layer (for instance, of Al₂O₃) is applied. After that, again using the photolithography procedure a mask 18 (FIG. 13) is produced to protect from etching an area of the principal electrode 4 (FIG. 11) above which the control line is to be located. After that the layer 11 (FIG. 10) and the layer 23 are etched until the material of these layers in regions unprotected by the mask 18 is removed completely (FIG. 11). Thus, two other boundaries of the electrode 4 are formed which are arranged along the sides of the control line and which cross the area of the film 22. The electrode 4 boundaries formed in the course of the etching procedure are presented as sharp and abrupt relief steps the height of which is equal to the sum of the thickness of the layers 11 and 23 (FIG. 10), while the other boundaries of the electrode 4 that have been formed earlier are presented as smooth relief steps where an edge of the layer 23 (electrode 4) is covered with the layer 11. The height of these steps is equal to the thickness of only one layer 23.

After that, an insulation region 12 (FIG. 12) is formed along the abrupt boundaries of the electrode 4. The depth of this region is determined by the length l of the bridge jumper. The region 12 is formed by means of oxidizing the respective material to the required depth of the layer serving as the electrode 4. Then, a third superconducting layer (for instance, of niobium) is applied onto the structure obtained in this way. In the course of the procedure a break is made in the layer at the abrupt relief steps along the boundaries of the electrode 4. At other boundaries of the electrode 4 there should be no breaks. This is achieved, for instance, of depositing the material from the vapour phase under high vacuum using a directed vapour flow. The thickness of the third superconducting layer is selected so that it is less than the height of the abrupt relief steps, but greater than the height of the smooth relief steps.

Because of this arrangement the boundaries of the control line 6 (FIG. 6) in the third superconducting layer are formed so that they are automatically and precisely aligned with the boundaries of the electrode 4 (the abrupt relief steps). At the same time the boundaries of the electrodes 3 and 14 are formed so that the gap between them and the superconducting material of the electrode 4 is equal to the depth of the insulation region 12. Thus, two bridges of variable thickness and a control line 6 are formed, the edges of the control line 6 being precisely aligned with the boundaries between the electrodes 3 and 14 and the respective jumpers.

Then, photolithography procedures are used to form other boundaries of the electrodes 3 and 14, the lead-in paths 7 and 8 and the control line 6.

The same sequence of operation will provide a cryotron with a hole 9 in the electrode 4 shown in FIG. 3. The only difference is in the form of the mask 19 (FIG. 14). In the given cryotron design the abrupt boundaries of the electrode 4 (FIG. 4) are formed along the sides of the bus 6. The alignment of one of the sides of the bus 6 with the boundary between the electrode 3 and the jumper 5 of the bridge and the alignment of the other side with the edge of the hole 9 are obtained automatically.

In order to produce the isolation region 12 in the cryotron with one or two bridges the procedure of etching the layer 23 (FIG. 10) may be used. In this case the insulation region 21 (FIG. 15) will be in the form of an air gap determining the length l of the jumper.

The essence of the method of manufacturing cryotrons according to the present invention will be better understood from the following description of the procedure of manufacturing a cryotron as shown in FIG. 15.

An oxidized silicon plate is used as a substrate 1. A layer of niobium 0.2 to 0.4 μm thick and then an insulation layer of Al₂O₃ about 0.5 μm thick are deposited onto the clean substrate 1 by the vacuum evaporation procedure. After that, in order to improve adhesion properties of the structure a thin (about 100 A) layer of metal (chromium) and a layer for the jumper 5 (gold) about 300 A thick are applied also by the vacuum evaporation procedure.

A region forming the jumper 5 of a bridge with a width W = 10 μm and approximately of the same length is then made by photolithography in the gold layer. Then a second niobium layer about 0.2 μm thick is applied by vacuum evaporation and two parallel boundaries of the electrode 4 are formed on this layer by means of photolithographic treatment with a gap of about 15 μm between them. The niobium layer, according to this procedure, is treated with an etchant that does not affect the material of the jumper 5. Basic components of this etchant are sodium fluoride and concentrated nitric acid. An isolation layer of Al₂O₃ with a thickness of about 0.4 to 0.6 μm is then deposited on the surface of the structure by vacuum evaporation. Then a contact mask 19 (FIG. 14) with a hole 20 is formed by means of photolithography to obtain a hole 9 (FIG. 4) in the electrode. The width of the control line 6 is selected to be 2 μm and the size of the hole 20 is selected so that the inductance of the circuit in the electrode 4 (FIG. 4) around the hole 9 exceeds that of the line 6 area (10×12 μm) located above the electrode 4 by a factor of 3 to 5. Then the Al₂O₃ layer and, after it, the niobium layer are subjected to the etching procedure. First an etchant for Al₂O₃ (for instance, ortho-phosphoric acid) and then an etchant fo niobium, specified above, that would not affect the Al₂O₃ layer are used. The etching continues until the material of these layers at the areas unprotected by the mask is removed completely and until an insulation region 21 is formed as an air gap along the boundaries of the electrode 4. The region 21 is produced by partial etching out of the niobium from under the Al₂O₃ layer.

Instead of etching out the niobium in an acid solution the same effect can be obtained by ion etching (as is done to manufacture the cryotron embodiment shown in FIG. 3) until the niobium layer is removed completely. Then, to obtain an insulation region 12 that would be equal to the required length l of the bridge jumper it is necessary to subject the niobium layer to a thermal oxidation procedure along the boundaries of the electrode 4 to the required depth of about 0.2 μm.

After that, a niobium layer of about 0.2 μm is deposited onto the surface of the structure obtained in this manner in a high vacuum from the vapour phase. A break is made in this layer at a relief step along the boundaries of the electrode 4. The same layer is then used to form the other boundaries of the electrode 3 and the line 6 by a photolithographic treatment.

The performance of the cryotron manufactured as described above is as follows:

Operation temperature ... 4.2° K
Critical current ... $I_o = 1$ to 2 mA
Voltage in resistive state ... $I_o R = 0.1$ to 0.4 mV
(where R is the resistance of the bridge jumper)
Current gain factor ... $G = 1.3$ to 1.5
Switching time ... $\tau \leq 100$ ps
Switching power ... $\Delta E \leq 10^{-16}$ j.
Occupied area ... $S \leq 500$ $\mu m^2$.

What is claimed is:

1. A thin-film cryotron comprising: a superconducting layer serving as a ground plane; a first insulation layer located on said ground plane; a first superconducting thin-film electrode located on said first insulation layer having a lead-in path; a second superconducting film electrode located on said first insulation layer having a lead-in path; a first conducting jumper between said first and second superconducting electrodes made of a film thinner than that of said electrodes, said first and second superconducting electrodes being weakly connected by means of said jumper to form a bridge of variable thickness serving as a distributed Josephson junction; a control line made of a superconducting thin film strip located above a respective electrode and displaced from a boundary between said respective electrode and said jumper by distance less than the width of said jumper.

2. A thin-film cryotron as claimed in claim 1, wherein said respective electrode has a hole made near said control line on the said opposite to said jumper.

3. A thin-film cryotron as claimed in claim 1 wherein said respective electrode has a hole made near said control line on the side opposite to said jumper.

4. A thin-film cryotron as claimed in claim 3, wherein an edge of said hole is adjacent to a second side of said control line.

5. A thin-film cryotron as claimed in claim 1, wherein a first side of said control line is aligned with said boundary between said first electrode and said first jumper and a second side of said control line is aligned with the boundary between said third electrode and said second jumper.

6. A thin-film cryotron according to claim 1, wherein a first side of said control line is aligned with said boundary.

7. A thin-film cryotron as claimed in claim 1, further comprising: a third superconducting thin film electrode located on said first insulating layer; a second conducting jumper between said second and third electrodes made of a film thinner than that of said electrodes, said second jumper and third electrode being connected in series between said respective electrode and said lead-in path of said respective electrode to form, together with said respective electrode, a second bridge of variable thickness serving as a distributed Josephson junction, the length of said respective electrode being selected so that the gap between said control line and a boundary between said respective electrode and said second jumper does not exceed the width of said second jumper.

8. A thin-film cryotron according to claim 1, wherein the width of said jumper greatly exceeds the length of said jumper.

* * * * *